(12) United States Patent
Herr et al.

(10) Patent No.: US 7,982,646 B2
(45) Date of Patent: Jul. 19, 2011

(54) METHOD AND APPARATUS FOR MATCHED QUANTUM ACCURATE FEEDBACK DACS

(75) Inventors: Quentin P. Herr, Ellicott City, MD (US); Aaron A. Pesetski, Gambrills, MD (US); John X. Przybysz, Severna Park, MD (US); Donald L. Miller, Export, PA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/184,204

(22) Filed: Jul. 31, 2008

(65) Prior Publication Data
US 2010/0026538 A1 Feb. 4, 2010

(51) Int. Cl.
*H03M 3/00* (2006.01)
(52) U.S. Cl. ........................................ 341/143; 341/133
(58) Field of Classification Search .................. 341/133, 341/155, 144, 143
See application file for complete search history.

(56) References Cited

U.S. PATENT DOCUMENTS

| | | | |
|---|---|---|---|
| 4,117,354 A | 9/1978 | Geewala | |
| 4,916,335 A | 4/1990 | Goto et al. | |
| 4,947,118 A * | 8/1990 | Fujimaki | 324/248 |
| 5,099,152 A | 3/1992 | Suzuki | |
| 5,140,324 A * | 8/1992 | Przybysz et al. | 341/133 |
| 5,309,038 A | 5/1994 | Harada et al. | |
| 6,157,329 A * | 12/2000 | Lee et al. | 341/133 |
| 6,188,236 B1 | 2/2001 | Wikborg | |
| 6,507,234 B1 | 1/2003 | Johnson et al. | |
| 6,509,853 B2 * | 1/2003 | Gupta | 341/133 |
| 6,518,786 B2 | 2/2003 | Herr | |
| 6,549,059 B1 | 4/2003 | Johnson | |
| 6,608,581 B1 * | 8/2003 | Semenov | 341/155 |
| 6,724,216 B2 | 4/2004 | Suzuki et al. | |
| 6,750,794 B1 | 6/2004 | Durand et al. | |
| 6,865,639 B2 | 3/2005 | Herr | |
| 6,960,780 B2 | 11/2005 | Blais et al. | |

(Continued)

FOREIGN PATENT DOCUMENTS
EP 0467104 1/1902
(Continued)

OTHER PUBLICATIONS
U.S. Appl. No. 11/634,632, filed Jan. 2007, Herr.
(Continued)

*Primary Examiner* — Peguy JeanPierre
(74) *Attorney, Agent, or Firm* — Tarolli, Sundheim, Covell & Tummino LLP

(57) ABSTRACT

A second order superconductor delta-sigma analog-to-digital modulator having an input for receiving an analog signal, a first integrator coupled to the input, a second integrator cascaded with the first integrator, and a quantum comparator digitizing output from the second integrator reduces quantization noise by providing matched quantum accurate DACs in a feedback loop between output from the quantum comparator and input to the first integrator. The matched quantum accurate feedback DACs produce identically repeatable voltage pulses, may be configured for multi-bit output, may be time-interleaved to permit higher clocking rates, and may be employed in a balanced bipolar configuration to allow inductive input coupling. Bipolar feedback is balanced when gain of a first DAC exceeds gain of a matched, opposite polarity DAC by the amount of implicit feedback from the comparator into the second integrator.

29 Claims, 4 Drawing Sheets

U.S. PATENT DOCUMENTS

| | | | |
|---|---|---|---|
| 7,038,604 B2 * | 5/2006 | Hirano et al. ............... 341/133 |
| 7,064,697 B2 * | 6/2006 | Taylor et al. ............... 341/137 |
| 7,227,480 B2 * | 6/2007 | Furuta et al. ............... 341/133 |
| 7,375,666 B2 * | 5/2008 | Melanson ............... 341/143 |
| 7,495,593 B2 * | 2/2009 | Wang ............... 341/143 |
| 7,498,832 B2 | 3/2009 | Baumgardner et al. |
| 7,719,453 B2 * | 5/2010 | Kim et al. ............... 341/133 |
| 2002/0063643 A1 | 5/2002 | Smith et al. |
| 2002/0190381 A1 | 12/2002 | Herr et al. |
| 2003/0011398 A1 | 1/2003 | Herr |
| 2003/0016069 A1 | 1/2003 | Furuta et al. |
| 2003/0039138 A1 | 2/2003 | Herr |
| 2003/0040440 A1 | 2/2003 | Wire et al. |
| 2003/0115401 A1 | 6/2003 | Herr |
| 2003/0183935 A1 | 10/2003 | Herr et al. |
| 2004/0120444 A1 | 6/2004 | Herr |
| 2004/0201099 A1 | 10/2004 | Herr |
| 2004/0201400 A1 | 10/2004 | Herr |
| 2005/0001209 A1 | 1/2005 | Hilton et al. |
| 2005/0023518 A1 | 2/2005 | Herr |
| 2005/0078022 A1 | 4/2005 | Hirano et al. |
| 2005/0110106 A1 | 5/2005 | Goto et al. |
| 2005/0224784 A1 | 10/2005 | Amin et al. |
| 2008/0129368 A1 | 6/2008 | Furuta et al. |

FOREIGN PATENT DOCUMENTS

| | | |
|---|---|---|
| WO | WO 2005/093649 | 10/2005 |
| WO | PCT/US2008/072017 | 8/2008 |

OTHER PUBLICATIONS

Berns et al., "Coherent Quasiclassical Dynamics of a Persistent Current Qubit", *Physical Review Letters APS USA*, vol. 97, No. 15, pp. 150502, Oct. 13, 2006.

Garanin et al., Effects of nonlinear sweep in the Landau-Zener-Stueckelberg effect, *Physical Review B*, vol. 66, No. 17, pp. 174438-1-174438-11, Nov. 1, 2002.

Wulf et al., Dressed States of Josephson Phase Qubit Coupled to an LC Circuit, *IEEE Transaction on Applied Superconductivity IEEE USA*, vol. 15, No. 2, pp. 856-859, Jun. 2, 2005.

International Search Report for International Application No. PCT/US2008/050864; European Patent Office, May 30, 2008; 3 pages.

Miller et al.: "*Flux Quantum Sigma-Delta Analog-to-Digital Converters for RF Signals*"; IEEE Transactions on Applied Superconductivity, IEEE Service Center, Los Alamitos, CA US, vol. 9, No. 2, Jun. 1, 1999, XP011005528, ISSN: 1051-8223.

International Search Report for corresponding PCT/US2009/052107, mailed Dec. 30, 2009 by Henk Beindorff of the EPO.

* cited by examiner

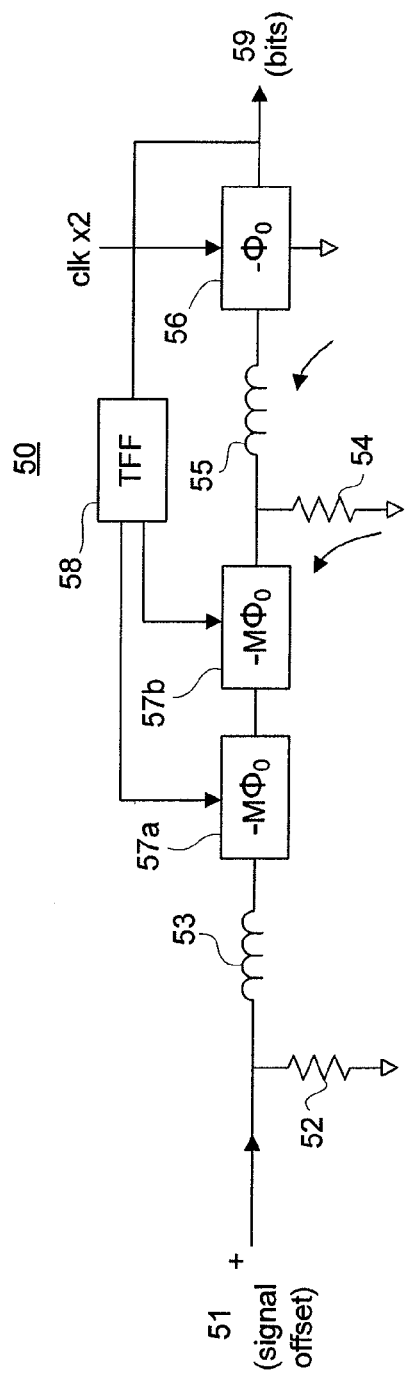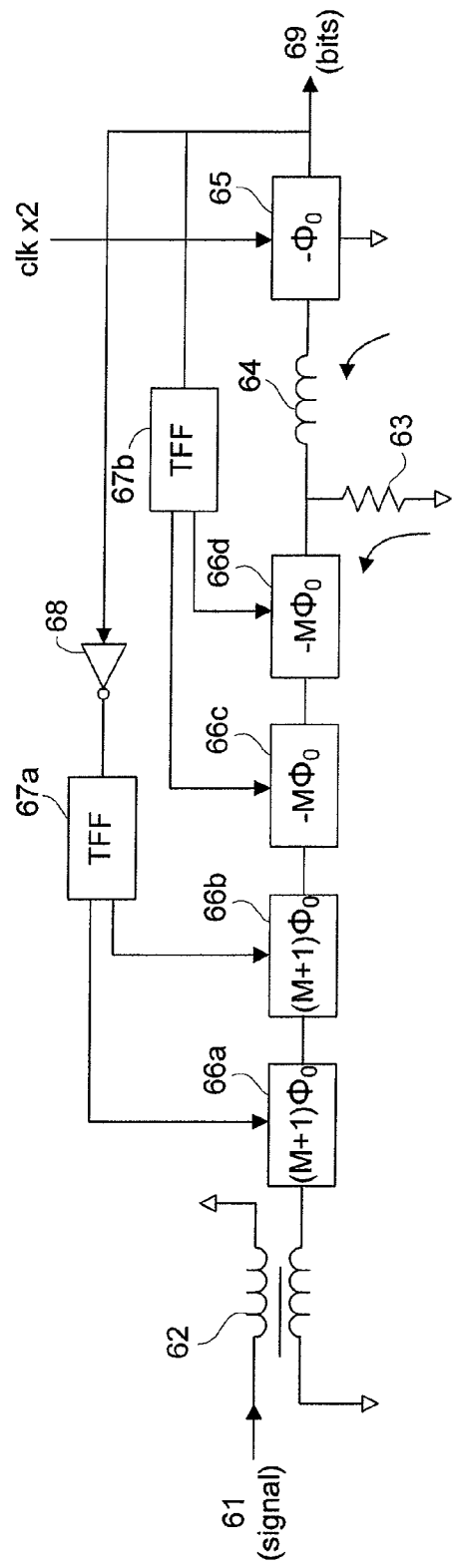
FIG. 5
FIG. 6

METHOD AND APPARATUS FOR MATCHED QUANTUM ACCURATE FEEDBACK DACS

BACKGROUND OF THE INVENTION

1. Field of the Invention

The present invention relates generally to analog-to-digital converters, and more specifically to superconducting analog-to-digital delta-sigma modulators employing quantum accurate digital-to-analog converters for noise reduction.

2. Description of Related Art

Delta-sigma analog-to-digital converter (ADC) performance depends on accurate feedback and short comparator decision time. Superconducting circuits are an attractive technology for use in delta-signal converters because they can achieve both of these design constraints due to inherent quantization and picosecond timescale switching of the Josephson junction. Comparator performance can be characterized in terms of both sensitivity and decision time. Sensitivity depends on thermal noise and has been a primary focus for Josephson comparators in the past. The delta-sigma architecture is tolerant of sensitivity errors due to feedback, but the feedback mechanism requires a short decision time, ideally a small fraction of the sample period.

FIG. 1 shows a schematic of a proven first order superconductor delta-sigma modulator. An analog input signal 11 is inductively coupled through an inductor 12 to a quantum comparator formed by two series Josephson junctions 13 and 14. A clock signal of frequency clk/2 is applied to another Josephson junction 15 to provide a DC offset $V=\phi_0 \cdot clk/2$ to the comparator, where $\phi_0=h/2e$ is a fundamental physical unit called the single-flux-quantum. This value of DC offset ensures that the comparator triggers every other clock cycle, i.e. to allow the circuit to dither about an operating point of 1-0-1-0 ... (etc.). Junctions 13 and 14 constitute a Josephson comparator that produces a digital output 16 in the form of a bit stream of binary ones and zeroes, with a binary one defined as a voltage pulse (or single-pulse quantum) generated by a Josephson junction. Clock signal clk is applied to junction 13 so that every clock cycle, either junction 13 or junction 14 will trigger, depending on the amount of current in the inductor 12. For example, junction 13 may trigger when the comparator is below a current threshold, producing a binary zero at output 16. At another clock cycle, when inductor current exceeds the current threshold, junction 14 may trigger to produce a binary one at output 16. In the latter case, the voltage pulse is also applied as back emf which reduces current flow into the comparator, providing implicit feedback $-\phi_0$ at the same level as the output signal.

FIG. 2 shows a schematic of a proven second order superconductor delta-sigma modulator. An analog input signal 21 is coupled directly to the circuit across a resistor 22 to provide a desired voltage offset. An inductor 23 forms a first integrator with resistor 22, and this integrator is cascaded with a second integrator formed by resistor 24 and inductor 25. The output of the second integrator is coupled to a quantum comparator formed by series Josephson junctions 26 and 27. These junctions behave as in the comparator of FIG. 1 to produce a digital bit stream at output 29. As long as signal current in the second integrator remains below the threshold of the comparator, junction 26 will trigger with each clock cycle to produce a binary zero at output 29. When the signal current exceeds the threshold, junction 27 triggers, producing a binary one at the output, and generating an implicit feedback of $-\phi_0$ into the second integrator. This feedback signal is amplified in an explicit feedback loop by a quantum digital-to-analog converter (DAC) 28 having a gain of fifty $\phi_0$ to decrement the current in the first integrator. The magnitude of the gain in the feedback loop is selected depending on a desired level of signal isolation between the first and second integrators.

The foregoing second order delta-sigma ADC clocked at 20 GHz can achieve an oversampling ratio of 2000 with respect to a 0-10 MHz signal band. The ADC can approach 20 dB/decade quantization noise suppression, in keeping with ideal quantization noise theory. Overall signal-to-noise ratio represents the current state of the art. ADC converters having performance beyond the state of the art would improve the performance of existing systems such as horizon-search radar, and enable new missions such as broadband digitization of the spectrum for space-based electronic surveillance. The keys to high performance in delta-sigma ADCs are high oversampling clock rates and accuracy in the feedback DAC. Thus, superconductor ADC modulators may be advanced beyond the state of the art by optimizing the design of the DAC converter that is used in the feedback loop.

SUMMARY OF THE INVENTION

The present invention discloses methods and apparatus for reducing quantization noise in a superconductor delta-sigma analog-to-digital modulator. An apparatus according to the invention may be a superconductor delta-sigma ADC that includes an input for receiving an analog signal, a first integrator coupled to the input, a second integrator cascaded with the first integrator, a quantum comparator digitizing output from the second integrator, and matched quantum accurate DACs in a feedback loop between output from the quantum comparator and input to the first integrator. In one embodiment, the quantum comparator may be a Josephson comparator. The matched quantum accurate DACs may be selected to produce identically repeatable voltage pulses, and may be employed in a bipolar configuration in the feedback loop to permit inductive coupling of the input signal. Modulators according to the invention may be second or higher order modulators, and may generate single or multi-bit output. In another embodiment, the modulator may permit higher clocking rates by generating time-interleaved feedback. The time-interleaved feedback may be achieved by alternately driving matched quantum accurate DACs of like polarity using a toggle flip-flop in the feedback loop. In a bipolar interleaved embodiment, a flip-flop may be provided in the feedback loop for each pair of quantum accurate DACs of like polarity, and an inverter may be provided in the feedback loop to effect a polarity change. In any bipolar embodiment having first and second matched quantum accurate feedback DACs, the feedback is balanced when the gain of the first feedback DAC exceeds the gain of the second feedback DAC by a magnitude equivalent to implicit feedback from the comparator into the second integrator.

A related method according to the invention includes steps for integrating an analog signal through a first integrator, integrating an output of the first integrator through a second integrator, digitizing an output of the second integrator using a quantum comparator, and providing matched quantum accurate DACs in a feedback loop from output of the quantum comparator into the first integrator.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. In the drawings, like reference numerals may designate like parts throughout the different views, wherein:

FIG. 5 is a schematic diagram of a time-interleaved delta-sigma ADC using matched quantum accurate feedback DACs according to the invention.

FIG. 6 is a schematic diagram of a time-interleaved delta-sigma ADC using bipolar matched quantum accurate feedback DACs according to the invention

DETAILED DESCRIPTION OF THE INVENTION

The following disclosure presents exemplary embodiments of the invention for employing matched quantum accurate DACs in feedback loops in superconducting delta-sigma ADCs. Converters according to the invention are enabled by the use of multiple quantum accurate feedback DACs that employ the same physical operating principle as the metrological voltage standard. That is, each superconducting DAC is regulated by an internal quantum mechanical mechanism that produces voltage pulses that are identically repeatable. This voltage standard provides a quantum mechanically accurate standard to measure signals with superconductor ADCs. Each DAC used in any particular embodiment is perfectly matched, meaning that it is perfectly calibrated relative to all other DACs in the circuit. Modulators according to the invention are either single bit, multi-bit or time-interleaved, and may include features such as an inductively coupled input and bipolar feedback.

Figure 3:
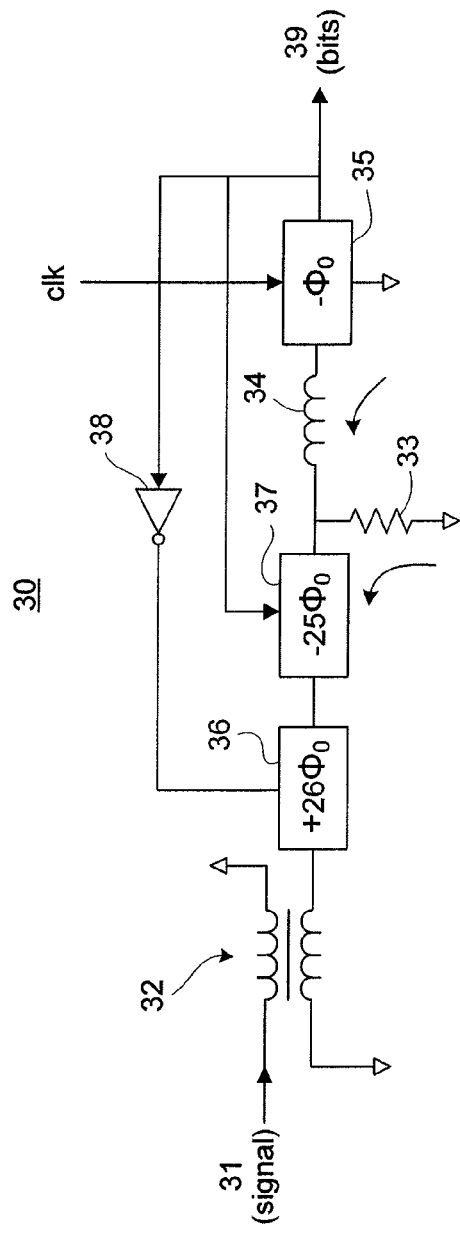
FIG. 3 is a schematic diagram of one embodiment of a single bit delta-sigma ADC using bipolar matched quantum accurate feedback DACs according to the invention.

FIG. 3 illustrates one embodiment 30 of a single bit delta-sigma ADC that uses bipolar matched quantum accurate feedback DACs according to the invention. In this ADC, as well in other embodiments herein described, a quantization noise shaping performance of 40 db/decade has been demonstrated. ADC 30 is a second-order modulator with first and second integrating loops. An analog input signal 31 may be inductively coupled to the circuit through inductor 32, as shown. Inductor 32 may be a step-down transformer, for example, with multiple windings on the primary and a fewer windings on the secondary, to step current up on the secondary side.

Figure 1:
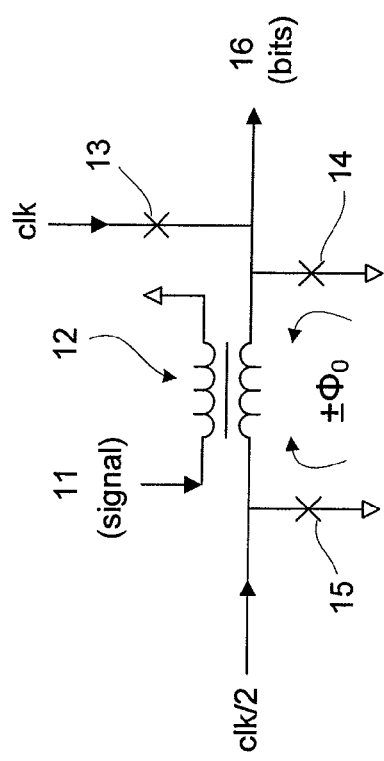
FIG. 1 is a schematic diagram of a prior art first order superconducting delta-sigma ADC.

The first integrating loop may be formed by inductor 32 and a resistor 33 that is coupled between the inductor and ground. This integrator is cascaded with the second integrator. The second integrating loop may be formed by resistor 33 and a second inductor 34. The size of resistor 33 therefore determines the strength of the coupling between the two integrators. The output of the second integrating loop may be coupled to a quantum comparator 35, as shown, which digitizes the output of the second integrator by generating a single bit output 39. In one embodiment, quantum comparator 35 may include two series Josephson junctions, which may operate as described in the context of FIG. 1 by generating a voltage pulse $-\phi_0$ equivalent to a binary one when current in the inductor 34 exceeds a threshold. When this occurs, implicit feedback of $-\phi_0$ is generated from comparator 35 back into the second integrator, as indicated by the curved arrow pointing toward the input stage of the circuit. Concurrently, explicit bipolar feedback is generated from comparator 35 to the first integrator, either through a positive quantum accurate feedback DAC 36, or through a negative quantum accurate feedback DAC 37.

The bipolar feedback concept essentially compensates for the absence of a DC offset at the input. With this arrangement, if the comparator 35 is below the current threshold, then a zero is generated at the output 39 and no implicit feedback occurs. Explicit feedback, however, occurs through the positive feedback loop. An inverter 38 in the positive feedback loop inverts the zero to a one, which feeds back positive current to the first integrator through positive feedback DAC 36 to drive the signal current up to the threshold. As long as the output of comparator 35 is zero, negative feedback DAC 37 will remain inactive.

When the comparator 35 is driven above threshold, it produces an output pulse, or a binary one. This turns off the positive feedback loop and turns on the negative feedback loop to pull the signal current down through negative feedback DAC 37. Concurrently, implicit feedback of $-\phi_0$ is generated from the comparator into the second integrator. The explicit and implicit feedback have an additive effect. In an exemplary embodiment, when comparator 35 outputs a binary one, the sum of the implicit and explicit feedback is exactly equal in magnitude but opposite in polarity to the explicit feedback generated when comparator 35 produces a binary zero. Thus, as illustrated in ADC 30, the gain (+26) of positive feedback DAC 36 may be exactly one integer greater than the gain (−25) of negative feedback DAC 37, to ensure that the circuit is perfectly balanced to dither about the 1-0-1-0 . . . (etc.) operating point.

Exact integral values may be achieved by selecting DAC 36 and DAC 37 to be matched quantum accurate feedback DACs. For example, DACs 36 and 37 may be constructed from a series array, or combination series and parallel array, of Josephson junctions that produce identically repeatable voltage pulses of a desired magnitude. The gain values +26 and −25 have been arbitrarily selected for illustration only, and do not limit the invention. Other gains may be selected, and the magnitudes of the gains may be identical, or they may differ by one or more integers without departing from the scope of the invention.

Providing bipolar feedback according to the invention advantageously enables the input signal to be inductively coupled to ADC 30. This avoids the need for an input resistor, such as resistor 22 in FIG. 2, which can create an undesirable impedance mismatch that reflects a large percentage of the input power. Inductive coupling gives the designer considerable freedom for impedance matching the ADC, for example, by varying the winding ratio of the transformer 32.

Figure 4:
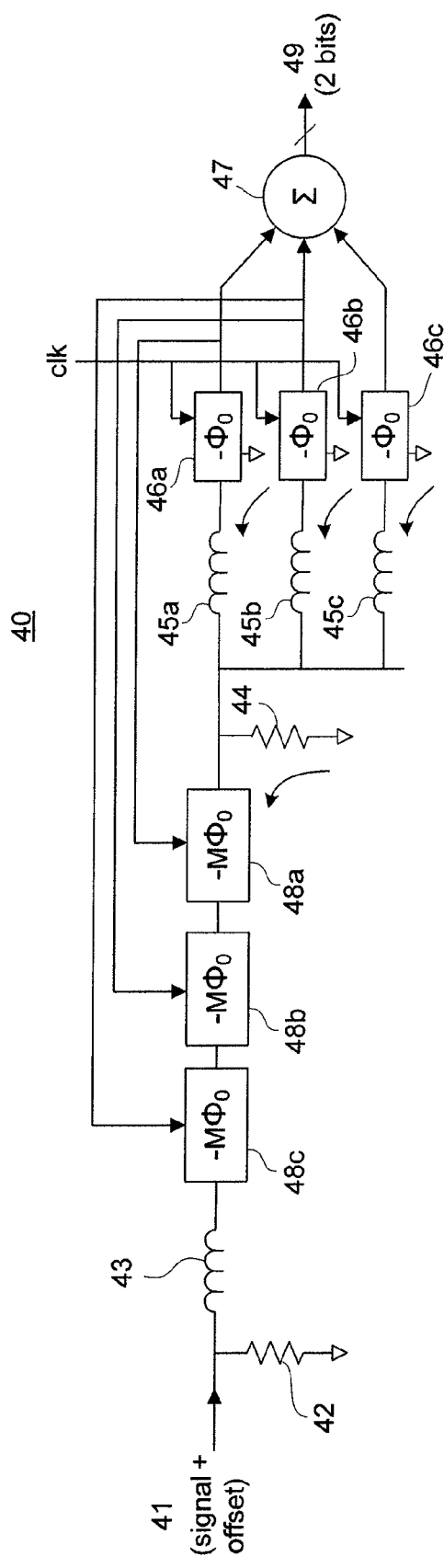
FIG. 4 is a schematic diagram of one embodiment of a multi-bit delta-sigma ADC using matched quantum accurate feedback DACs according to the invention.

FIG. 4 illustrates an embodiment 40 of a multi-bit delta-sigma ADC that uses matched quantum accurate feedback DACs in another configuration according to the invention. ADC 40 is a second order modulator that produces a two-bit output. That is, the output signal 49 may be formed from contributions from four signal levels (0, 1, 2 or 3 outputs) that collectively represent two bits of information, expressed in thermometer code.

An analog signal 41 is coupled directly to ADC 40 across a resistor 42 that provides a desired offset voltage. A first integrator modeled by inductor 43 and resistor 42 is cascaded with a second integrator modeled by resistor 44 and inductors 45a, 45b, and 45c. The output of the second integrator is coupled to a parallel configuration of quantum comparators 46a, 46b, and 46c, each in series with a corresponding inductor 45a, 45b, or 45c, as shown. These comparators may be matched comparators selected to produce identically repeatable voltage pulses. Each comparator may be biased to trigger at a different threshold current, for example, by inductively coupling different levels of DC offset into each inductor 45a, 45b, or 45c. For example, flux biases of 0, $\phi_0/3$, and $2\phi_0/3$ may be applied to inductors 45a, 45b, and 45c, respectively, to equally space the four levels. In one embodiment, inductors 45a, 45b, and 45c and comparators 46a, 46b, and 46c are configured as a phase wheel.

As each comparator 46a, 46b, or 46c triggers, the second integrator receives implicit feedback of $-\phi_0$ caused by the triggering comparator. Concurrently, explicit feedback into the first integrator is generated through one of three matched quantum accurate feedback DACs 48a, 48b, and 48c, each having a gain of $-M\phi_0$. The outputs of the comparators are summed by a digital adder 47 to provide the multi-bit output 49. If none of the comparators trigger, adder 47 outputs a binary zero (0 0), and no feedback occurs. If one of the comparators trigger, adder 47 outputs a binary one (0 1), and a combination of explicit and implicit feedback $(-(M+\frac{1}{3})\phi_0)$ drives the integrated signal current back down. If the integrated signal current is sufficient to cause two of the comparators to trigger, adder 47 outputs a binary two (1 0), and exactly twice as much feedback $(-2(M+\frac{1}{3})\phi_0)$ is generated. If the integrated signal current causes all three comparators to trigger, adder 47 outputs a binary three (1 1), and exactly three times as much feedback $(-3(M+\frac{1}{3})\phi_0)$ is generated.

FIG. 5 illustrates an embodiment 50 of a time-interleaved delta-sigma ADC using matched quantum accurate feedback DACs according to the invention. ADC 50 operates in similar fashion as the ADC shown in FIG. 2. An analog input signal 51 is coupled directly to the circuit across a resistor 52 to provide a desired voltage offset. A first integrator modeled by inductor 53 and resistor 52 is cascaded with a second integrator modeled by resistor 54 and inductor 55. The output of the second integrator is coupled to a quantum comparator 56. The quantum comparator 56 generates a digital bit stream at output 59 as it triggers in response to the level of integrated signal current fluctuating about a threshold, generating implicit feedback of $-\phi_0$ into the second integrator and explicit feedback of $-M\phi_0$ through a feedback loop into the first integrator when triggering to output a binary one.

Figure 2:
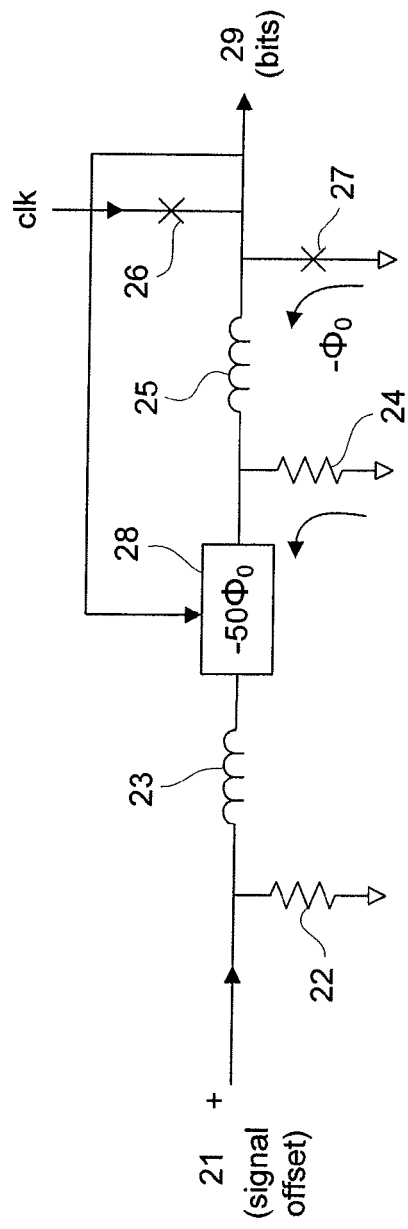
FIG. 2 is a schematic diagram of a prior art second order superconducting ADC.

The time-interleaved embodiment 50 addresses a problem in the circuit of FIG. 2 caused by the feedback DAC 28 having a limited repetition rate and being the slowest component in the circuit. The problem is alleviated in ADC 50 by clocking the quantum comparator twice as fast as the maximum allowable clock rate (i.e. clk×2) and alternating the explicit feedback signal through two matched quantum accurate feedback DACs 57a, 57b in the feedback loop. A toggle flip-flop 58 may be provided in the feedback loop upstream of DACs 57a and 57b to switch the feedback signal between them, essentially clocking each DAC at half the frequency of the clock speed, and thereby reducing the repetition rate of each feedback DAC by a factor of two. Importantly, the interleaved design of ADC 50 is fully effective only if feedback DACs 57a and 57b have identical gains, which is achievable by utilizing quantum accurate DACs according to the invention.

FIG. 6 illustrates an embodiment 60 of a delta-sigma ADC that combines the bipolar and time-interleaved features using matched quantum accurate feedback DACs according to the invention. The bipolar feedback DACs in ADC 60 allow an input signal 61 to be inductively coupled to the circuit through an inductance or transformer 62, as explained above in the context of ADC 30. The time-interleaved feature allows for faster clocking speeds.

As in previous embodiments, the input signal 61 is cascaded through first and second integrators formed by inductance 62, resistance 63, and inductance 64. Quantum comparator 65 triggers at a current threshold, generating implicit feedback $-\phi_0$ into the second integrator and a single bit, binary one at the output 69. Quantum comparator 65 may be clocked at about twice the maximum frequency (clk×2) allowed in a non-interleaved circuit such as ADC 30.

The output of quantum comparator 65 is fed back to the first integrator as explicit bipolar feedback through either of two loops, depending on whether the comparator is above or below threshold. If the current in comparator 65 is below threshold a binary zero is generated at the output 69, turning off the negative feedback loop, and turning on the positive feedback loop (by means of inverter 68) to drive the signal current above threshold. Each time the positive loop turns on, toggle flip-flop 67a switches the feedback signal between a first pair of matched quantum accurate DACs 66a and 66b, clocking each DAC at half the frequency of the clock speed, as in the embodiment of ADC 50. If the current in comparator 65 is above threshold, a binary one is generated at the output 69, turning off the positive feedback loop (by means of inverter 68) and turning on the negative feedback loop to pull the signal current down below threshold. Each time the negative loop turns on, toggle flip-flop 67b switches the feedback signal between a second pair of matched quantum accurate DACs 66c and 66d so that each is clocked at half the clock speed.

Feedback DACs 66a, 66b, 66c, and 66d may be matched quantum accurate DACs according to the invention. The feedback signal alternates among the four DACs according to the state of comparator 65 and to the states of flip-flops 67a and 67b so that the DACs collectively provide bipolar feedback from the digital output of ADC 60 into the first integrator, allowing the input signal to dither about a desired operating point. In one embodiment, the gains of the positive feedback DACs 66a and 66b are identical, and the gains of the negative feedback DACs 66c and 66d are identical. In another embodiment, the gain of each member (67a or 67b) of the first pair of DACs exceeds the gain of each member (67c or 67d) of the second pair of DACs by a magnitude equivalent to the implicit feedback from comparator 65 into the second integrator. The latter case is depicted in ADC 60, which defines the gain of each positive feedback DAC as $(M+1)\phi_0$ and the gain of each negative feedback DAC as $-M\phi_0$, so that the explicit positive feedback in any clock cycle is equal and opposite the combination of explicit and implicit negative feedback in a subsequent cycle. Other gain differentials between negative and positive feedback DACs are possible within the scope of the invention.

Figure 7:
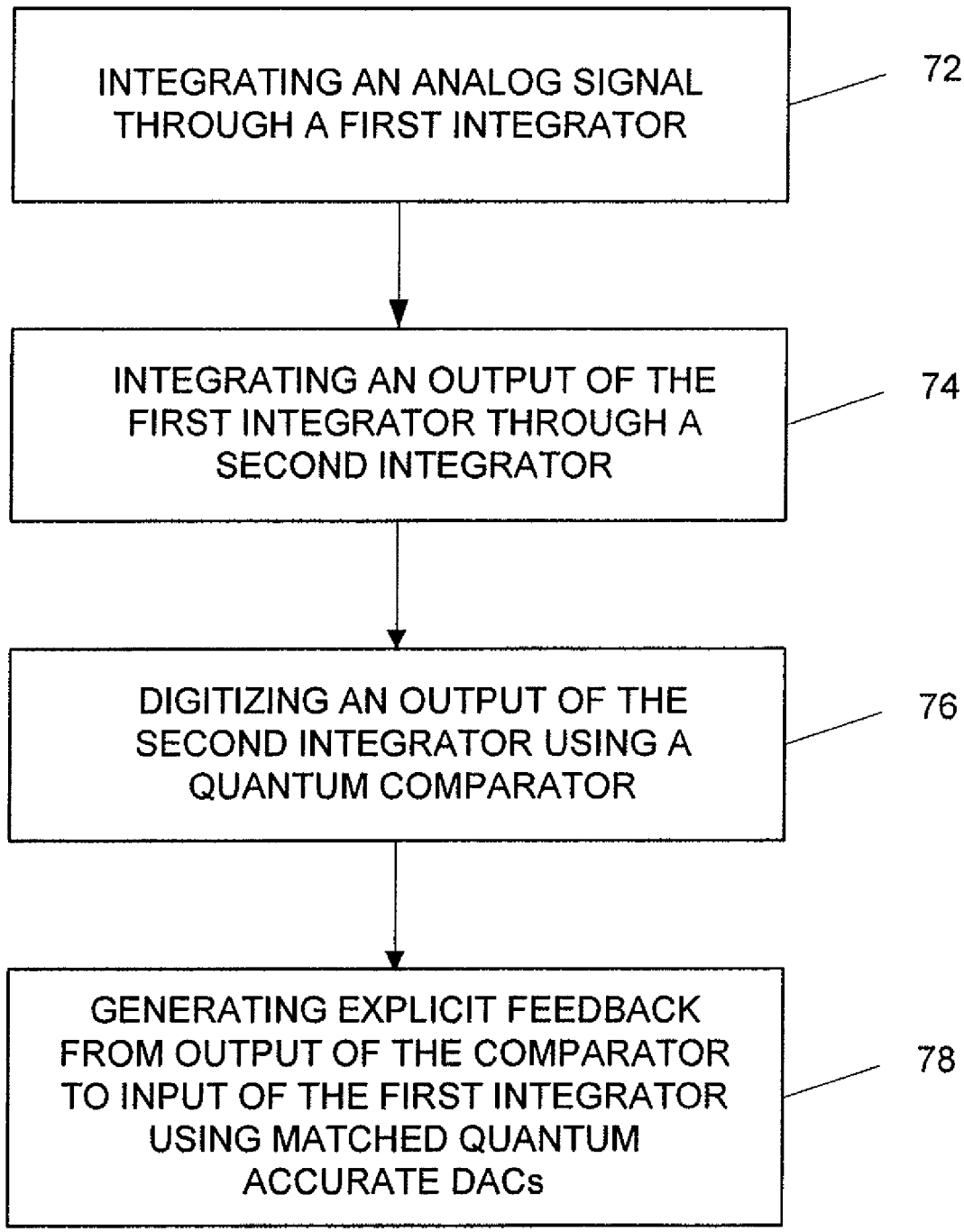
FIG. 7 is a process flow diagram illustrating one embodiment of a method according to the invention.

FIG. 7 illustrates a method 70 according to the invention for reducing quantization noise in a superconductor delta-sigma analog-to-digital modulator. The process flow chart captures the salient points of a method of the invention that is consistent with the teachings and descriptions of the foregoing circuit embodiments. Method 70 begins at step 72, in which an analog signal is integrated through a first integrator. Next, in step 74, the output of the first integrator is integrated through a second integrator. In the next step 76, the output of the second integrator is digitized using a quantum comparator. The quantum comparator may be a Josephson junction pair. In the final step 78, explicit feedback is generated from the output of the comparator to the input of the first integrator using matched quantum accurate DACs in a feedback loop. The feedback DACs may be regulated by an internal quantum mechanical mechanism that produces voltage pulses that are identically repeatable. Additional process steps are possible according to the invention, including steps employing matched quantum accurate feedback DACs in an ADC to achieve bipolar feedback, to allow inductive coupling of an input signal, to generate single or multi-bit output, or to provide interleaved DACs in the feedback loop, in manners consistent with the foregoing descriptions.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A superconductor delta-sigma analog-to-digital modulator, comprising:
    an input for receiving an analog signal;
    a first integrator coupled to the input;
    a second integrator cascaded with the first integrator;
    a plurality of quantum comparators, each receiving an output from the second integrator;
    a digital adder configured to sum respective outputs of the plurality of quantum comparators to provide a multi-bit digital output; and
    matched quantum accurate DACs in a feedback loop between the outputs from the quantum comparators and input to the first integrator.

2. The modulator of claim 1 wherein the plurality of quantum comparators comprises a Josephson comparator.

3. The modulator of claim 1 wherein the matched quantum accurate DACs produce identically repeatable voltage pulses.

4. The modulator of claim 1 wherein the first integrator, the second integrator, and the plurality of comparators are configured as a phase wheel.

5. The modulator of claim 1 wherein the matched quantum accurate DACs generate a time-interleaved feedback signal.

6. The modulator of claim 5 wherein the feedback loop further comprises a toggle flip-flop alternating the feedback signal between a first quantum accurate DAC and a second quantum accurate DAC that is matched to the first quantum accurate DAC.

7. A superconductor delta-sigma analog-to-digital modulator, comprising:
    an inductively coupled input for receiving an analog signal;
    a first integrator cascaded with the inductively coupled input;
    a second integrator cascaded with the first integrator;
    a quantum comparator converting output from the second integrator into a digital output; and
    matched quantum accurate DACs providing a bipolar feedback signal in a feedback loop from the digital output into the first integrator.

8. The modulator of claim 7 wherein the first integrator comprises inductance of the inductively coupled input.

9. The modulator of claim 7 wherein the digital output is a one-bit output.

10. The modulator of claim 7 wherein the matched quantum accurate DACs include a first DAC transmitting feedback at a first polarity and a second DAC transmitting feedback at a second polarity opposite the first polarity.

11. The modulator of claim 10 further comprising an inverter in the feedback loop coupled to the second DAC.

12. The modulator of claim 10 wherein gain of the first DAC exceeds gain of the second DAC by a magnitude equivalent to the implicit feedback from the comparator into the second integrator.

13. The modulator of claim 12 wherein the gain of the first DAC plus gain of the quantum comparator is equal and opposite the gain of the second DAC.

14. The modulator of claim 7 wherein the bipolar feedback signal is time-interleaved.

15. The modulator of claim 14 further comprising a first pair of time-interleaved match quantum accurate DACs transmitting feedback at a first polarity, and a second pair of time-interleaved matched quantum accurate DACs transmitting feedback at a second polarity opposite the first polarity.

16. The modulator of claim 15 further comprising first and second toggle flip-flops in the feedback loop for alternating the feedback signal, respectively, between members of the first pair of matched quantum accurate DACs and members of the second pair of matched quantum accurate DACs.

17. The modulator of claim 16 further comprising an inverter in the feedback loop coupled between the digital output and the second pair of matched quantum accurate DACs.

18. The modulator of claim 15 wherein gain of each member of the first pair of DACs exceeds gain of each member of the second pair of DACs by a magnitude equivalent to implicit feedback from the comparator into the second integrator.

19. The modulator of claim 18 wherein the gain of a member of the first pair of DACs plus gain of the quantum comparator is equal and opposite the gain of a member of the second pair of DACs.

20. A method for reducing quantization noise in a superconductor delta-sigma analog-to-digital modulator, comprising:
    integrating an analog signal through a first integrator;
    integrating an output of the first integrator through a second integrator;
    digitizing an output of the second integrator using a quantum comparator; and
    generating explicit, bipolar feedback from output of the quantum comparator to input of the first integrator using matched quantum accurate DACs in a feedback loop, the matched quantum accurate DACs comprising a first DAC transmitting feedback at a first polarity and a second DAC transmitting feedback at a second polarity opposite the first polarity.

21. The method of claim 20 wherein the quantum comparator comprises a Josephson comparator.

22. The method of claim 20 wherein the matched quantum accurate DACs produce identically repeatable voltage pulses.

23. The method of claim 20 wherein the digitizing step further comprises generating a multi-bit output.

24. The method of claim 23 wherein the multi-bit output is generated by a phase wheel.

25. The method of claim 20 wherein the generating step further comprises generating time-interleaved feedback through the matched quantum accurate DACs.

26. The method of claim 25 wherein the feedback is toggled between the matched quantum accurate DACs by a flip-flop in the feedback loop.

27. The method of claim 20 wherein the feedback loop further comprises an inverter coupled to the second DAC.

28. A superconductor delta-sigma analog-to-digital modulator, comprising:
    an input for receiving an analog signal;
    a first integrator coupled to the input;

a second integrator cascaded with the first integrator;

a quantum comparator digitizing output from the second integrator; and matched quantum accurate DACs, configured to provide bipolar feedback, in a feedback loop between output from the quantum comparator and input to the first integrator, the matched quantum accurate DACs comprising a first DAC transmitting feedback at a first polarity and a second DAC transmitting feedback at a second polarity opposite the first polarity.

29. The modulator of claim 28, further comprising an inverter in the feedback loop coupled to the second DAC.

* * * * *